(12) United States Patent
Lee

(10) Patent No.: US 6,172,896 B1
(45) Date of Patent: Jan. 9, 2001

(54) LAYOUT ARRANGEMENTS OF FUSE BOXES FOR INTEGRATED CIRCUIT DEVICES, INCLUDING BENT AND STRAIGHT FUSES

(75) Inventor: Ho-cheol Lee, Seoul (KR)

(73) Assignee: Samsung Electronics Co., Ltd. (KR)

( * ) Notice: Under 35 U.S.C. 154(b), the term of this patent shall be extended for 0 days.

(21) Appl. No.: 09/351,729

(22) Filed: Jul. 12, 1999

(30) Foreign Application Priority Data

Nov. 5, 1998 (KR) .................................................. 98-47293

(51) Int. Cl.[7] .................................................. G11C 17/00
(52) U.S. Cl. .......................... 365/96; 365/225.7; 257/529; 257/209
(58) Field of Search .................................. 365/96, 225.7; 257/529, 209

(56) References Cited

U.S. PATENT DOCUMENTS

| | | | |
|---|---|---|---|
| 5,661,331 | * 8/1997 | Hebbeker et al. | 257/529 |
| 5,747,869 | 5/1998 | Prall et al. | 257/529 |
| 5,844,296 | * 12/1998 | Murray et al. | 257/529 |

* cited by examiner

*Primary Examiner*—Son T. Dinh
(74) *Attorney, Agent, or Firm*—Myers Bigel Sibley & Sajovec

(57) ABSTRACT

An integrated circuit device such as an integrated circuit memory device, includes a first fuse group such as a first laser fuse group including a plurality of first laser fuses each having a first narrow end, a second opposite end which is wider and a bent central portion. Pitches of the first end of the plurality of first laser fuses are narrow and pitches of the second end are wide. The plurality of first laser fuses are adjacent one another. A second fuse group such as a second laser fuse group includes a plurality of second laser fuses each having a first wide end, a second opposite end which is narrower, and a bent central portion. Pitches of the first end of the plurality of second laser fuses are wide and pitches of the second end are narrow. The second plurality of laser fuses are adjacent one another. The first ends of the laser fuses in the first laser fuse group are adjacent the first ends of laser fuses in the second laser fuse group. The second ends of the laser fuses in the first laser fuse group are adjacent the second ends of the laser fuses in the second laser fuse group. The central portions of the outer laser fuses of the first and second laser fuse groups are not bent, but straight. Accordingly, when a specific laser fuse is blown, neighboring laser fuses need not be damaged, and the density of the laser fuse area may be increased.

21 Claims, 2 Drawing Sheets

LAYOUT ARRANGEMENTS OF FUSE BOXES FOR INTEGRATED CIRCUIT DEVICES, INCLUDING BENT AND STRAIGHT FUSES

FIELD OF THE INVENTION

The present invention relates to integrated circuit devices, and more particularly, to layout arrangements of fuse boxes for integrated circuit devices, such as integrated circuit memory devices.

BACKGROUND OF THE INVENTION

Integrated circuit memory devices are widely used in consumer and commercial systems. As is well known, memory devices may be tested in various manners using several test parameters for determining whether they operate properly. However, a memory device whose cells are partly defective can be used normally if the defective cells are replaced with redundancy memory cells. The memory cells and the redundancy memory cells are connected to control circuits through fuses. Thus, if there is a defective memory cell, the fuse connected to the defective memory cell may be blown. Then, the redundancy memory cells are driven so that the defective memory cells are replaced with the redundancy memory cells.

Fuses for use in memory devices include electrical fuses blown by electricity and laser fuses blown by a laser beam. Electrical fuses are typically used in Electrically Erasable and Programmable Read Only Memory (EEPROM) devices and laser fuses are typically used in Dynamic Random Access Memory (DRAM) devices.

FIG. 1A is a layout arrangement diagram in a laser fuse box of a conventional integrated circuit memory device. Referring to FIG. 1A, laser fuses 111 through 116, used in a conventional memory device 101, have uniform widths W1 and pitches P1. Central portions 131 of the laser fuses 111 through 116 are blown by a laser.

As shown in FIG. 1A, if the pitches P1 of the laser fuses 111 through 116 are each the same, reducing the size of the memory device 101 may reduce the pitches P1 of the laser fuses 111 through 116 accordingly. If the pitches P1 of the laser fuses 111 through 116 are reduced, laser fuses adjacent a specific laser fuse to be blown may be damaged.

FIG. 1B is another layout arrangement diagram in a laser fuse box of a conventional memory device, which is disclosed in U.S. Pat. No. 5,747,869 to Prall et al. Referring to FIG. 1B, laser fuses 151 through 156 have narrow ends 151a through 156a, and wide ends 151b through 156b. Spaces S1 and S2 are beside the narrow ends 151a and 156a of the laser fuses 151 and 156, as shown in FIG. 1B. As the size of integrated circuit devices continues to decrease and the number of devices incorporated into integrated circuit devices continues to increase, it may be desirable to increase the laser fuse density. It also may be desirable to increase the laser fuse density without the need to reduce the pitch between fuses.

SUMMARY OF THE INVENTION

It is therefore an object of the present invention to provide integrated circuit devices in which when fuses are blown, the neighboring fuses need not be damaged.

It is another object of the present invention to provide integrated circuit devices that can increase the density of fuses.

These and other objects are provided according to the present invention, by a fuse box for an integrated circuit device that includes a plurality of spaced-apart fuses, each having a narrow end and a wide end and extending along a predetermined direction. The fuses occupy a rectangular area in the integrated circuit device, and at least one of the spaced-apart fuses has a bent central portion. By occupying a rectangular area, large spacing may be obtained between fuses, to reduce the likelihood of damage to adjacent fuses. Also, the density of the fuses may be increased.

More specifically, an integrated circuit device such as an integrated circuit memory device, includes a first fuse group such as a first laser fuse group including a plurality of first laser fuses each having a first narrow end, and a second opposite end which is wider. At least one of the plurality of first fuses includes a bent central portion. Pitches of the first end of the plurality of first laser fuses are narrow and pitches of the second end are wide. The plurality of first laser fuses are adjacent one another. A second fuse group such as a second laser fuse group includes a plurality of second laser fuses each having a first wide end, and a second opposite end which is narrower. At least one of the plurality of second fuses includes a bent central portion. Pitches of the first end of the plurality of second laser fuses are wide and pitches of the second end are narrow. The second plurality of laser fuses are adjacent one another. The bent portions preferably are oblique relative to the first and second ends.

The first ends of the laser fuses in the first laser fuse group are adjacent the first ends of laser fuses in the second laser fuse group. The second ends of the laser fuses in the first laser fuse group are adjacent the second ends of the laser fuses in the second laser fuse group. The central portions of the outer laser fuses of the first and second laser fuse groups are not bent, but straight. Accordingly, when a specific laser fuse is blown, neighboring laser fuses need not be damaged, and the density of the laser fuses may be increased.

DETAILED DESCRIPTION OF PREFERRED EMBODIMENTS

Figure 1A:
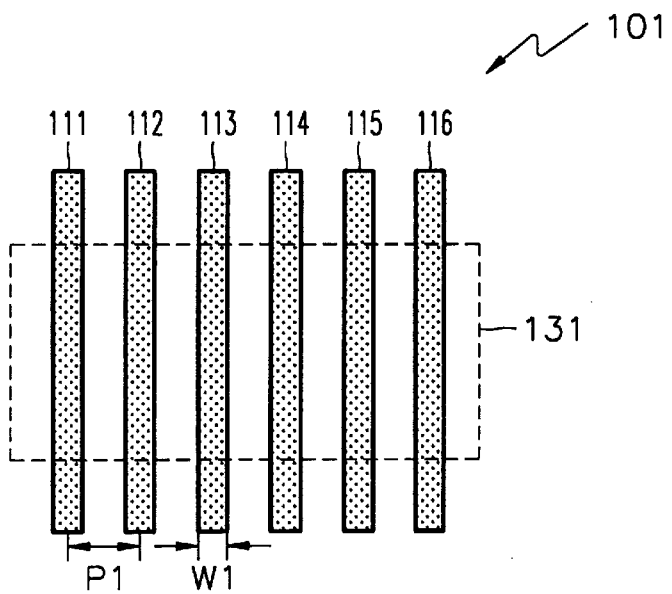
FIG. 1A is a layout arrangement diagram of a laser fuse box in a conventional memory device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the widths of layers and regions are exaggerated for clarity. Like numbers refer to like elements throughout.

Figure 2:
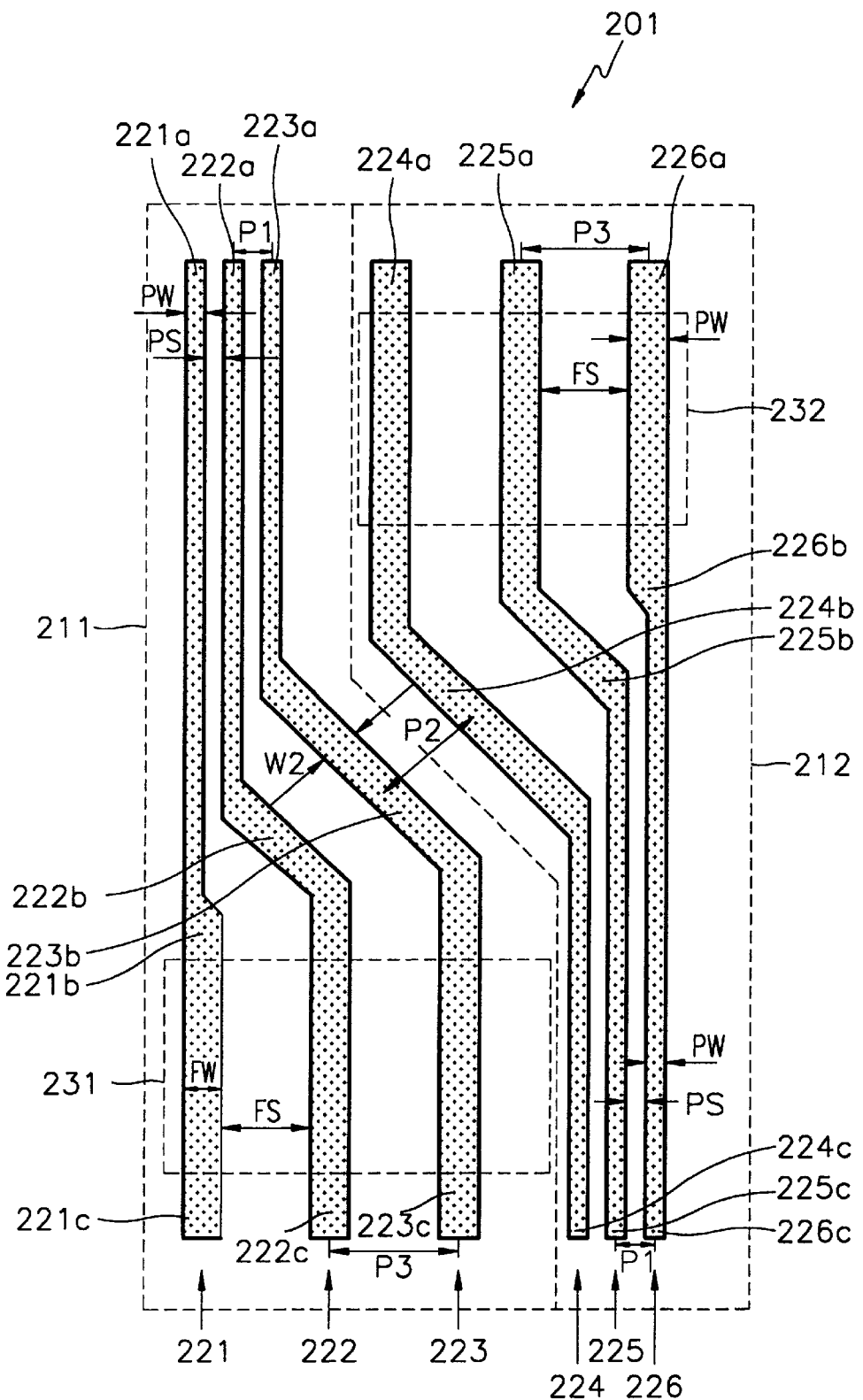
FIG. 2 illustrates laser fuses of a laser fuse box in integrated circuit memory devices according to a preferred embodiment of the present invention.

Referring now to FIG. 2, an integrated circuit memory device 201 includes first and second laser fuse groups 211 and 212.

The first laser fuse group 211 includes three laser fuses 221, 222 and 223. The laser fuses 221, 222 and 223 have narrow ends 221a, 222a and 223a, wide central portions 221b, 222b and 223b, and wide ends 221c, 222c and 223c. The central portions 222b and 223b of the laser fuses 222 and 223 are both bent, and the central portion 221b of the outer laser fuse 221 is not bent, but straight. The central portions 222b and 223b are positioned generally parallel to each other. The widths PW of the ends 221a, 222a and 223a of the laser fuses 221, 222 and 223, and the pitches P1 between the ends 221a, 222a and 223a, are narrow. The widths PW and pitches P1 of the ends 221a, 222a and 223a may be set by the minimum spacing and conductor design rules. The widths FW and pitches P3 of the opposite ends 221c, 222c and 223c are wide. Also, the widths W2 of the bent central portions 222b and 223b may be equal to or different from the widths FW of the opposite ends 221c, 222c and 223c.

The pitches P2 between the central portions 222b and 223b are greater than the pitches P1 between the ends 221a, 222a and 223a and are less than the pitches P3 between the opposite ends 221c, 222c and 223c. The pitches P2 between the central portions 222b and 223b may be equal to or greater than the pitches P3 between the opposite ends 221c, 222c and 223c. The widths FW and pitches P3 of the opposite ends 221c, 222c and 223c preferably are set to be greater than or equal to the laser fuse spacing and width design rules.

Laser fuses 221. 222 and 223 of section 231 are blown by a laser beam according to a fusing program. For example, when the laser fuse 221 is blown according to the fusing program, a laser is radiated into a portion of the opposite end 221c of the laser fuse 221 during a fusing operation. The portion exposed to the laser beam is vaporized, so that the laser fuse 221 is blown.

The second laser fuse group 212 includes three laser fuses 224, 225 and 226. The laser fuses 224, 225 and 226 have wide ends 224a, 225a and 226a, wide central portions 224b, 225b and 226b. and narrow ends 224c, 225c and 226c. The central portions 224b and 225b are both bent, and the central portion 226b of the outer laser fuse 226 is not bent, but straight. The bent central portions 224b and 225b are positioned parallel to each other. The widths FW of the ends 224a, 225a and 226a of the laser fuses 224, 225 and 226 and the pitches P3 between the ends 224a, 225a and 226a are wide, and the widths PW and pitches P1 of the opposite ends 224c, 225c and 226c are narrow. The widths W2 of the bent central portions 224b and 225b are equal to or less than the widths FW of the ends 224a, 225a and 226a. The pitches P2 between the central portions 224b and 225b are less than the pitches P3 between the ends 224a, 225a and 226a and are greater than the pitches P1 between the opposite ends 224c, 225c and 226c. The extent to which the central portions 224b and 225b are bent may be varied.

Selected laser fuses 224, 225 and 226 of section 232 are blown by a laser beam according to a fusing program.

The ends 221a, 222a and 223a of the first laser fuse group 211 are adjacent the ends 224a, 225a and 226a of the second laser fuse group 212. The opposite ends 221c, 222c and 223c of the first laser fuse group 211 are adjacent the opposite ends 224c, 225c and 226c of the second laser fuse group 212. The laser fuses 221 through 226 preferably comprise conductive polysilicon.

Although FIG. 2 shows that three laser fuses are included in the first and second laser fuse groups 211 and 212, the first laser fuse group 211 and the second laser fuse group 212 may include more than or fewer than three laser fuses. Also, the memory device 201 may include a plurality of laser fuse groups, inclusive of the First and second laser groups 211 and 212. In this case, the plurality of first and second laser groups 211 and 212 may be arranged alternately.

The laser fuse box may be used as a redundancy fuse box for replacing a defective memory cell with a redundancy memory cell if a normal memory cell is defective. The laser fuse box also may be used in other conventional applications.

Figure 1B:
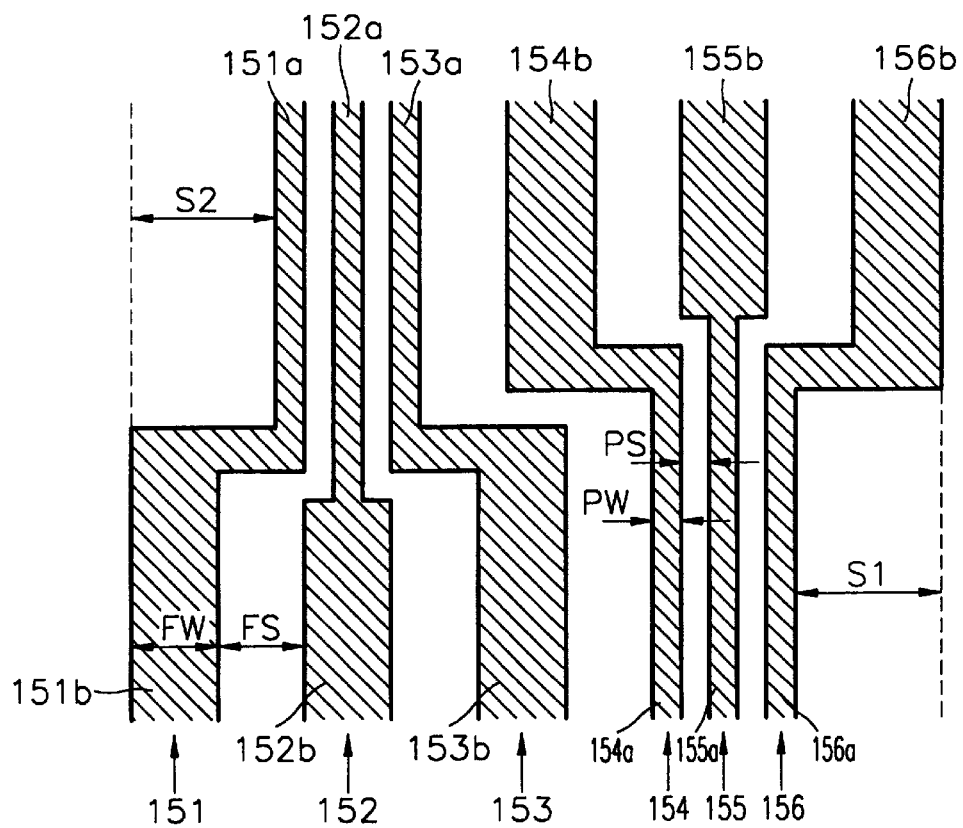
FIG. 1B is another layout arrangement diagram of a laser fuse box in a conventional memory device.

As described above, when a specific fuse is blown, blowing may take place without damaging a neighboring fuse adjacent the specific fuse, by arranging the laser fuses according to the present invention. Also, by arranging the laser fuses in such a manner as shown in FIG. 2, the density of the laser fuses may be greatly increased compared to that of the laser fuses shown in FIG. 1A or 1B. The overall width of the rectangular laser fuse box shown in FIG. 2 is equal to 3FW+3FS+3PW+2PS, whereas the overall width of the laser fuse box shown in FIG. 1B equals to 3FW+3FS+3PW+2PS+S1. That is to say, the rectangular laser fuse box shown in FIG. 2 occupies less space than that shown in FIG. 1B by the space S1.

Accordingly, when the memory device 201 is small and includes many laser fuses, a specific laser fuse can be blown without damaging a neighboring laser fuse, by arranging the laser fuses effectively. Also, the density of the memory device 201 can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A fuse box for an integrated circuit device, comprising:
a first fuse group including a plurality of first fuses each having a first narrow end and a second opposite end which is wider, at least one of the plurality of first fuses having a bent central portion, pitches of the first end of the plurality of first fuses being narrow, pitches of the second end being wide, and the plurality of first fuses being adjacent one another; and
a second fuse group including a plurality of second fuses each having a first wide end and a second opposite end which is narrower, at least one of the plurality of first fuses having a bent central portion, pitches of the first end of the plurality of second fuses being wide, pitches of the second end being narrow, and the plurality of second fuses being adjacent to one another,
wherein the first ends of the fuses in the first fuse group are adjacent the first ends of fuses in the second fuse group, the second ends of the fuses in the first fuse group are adjacent the second ends of the fuses in the second fuse group, and the central portions of the outer fuses of the first and second fuse groups are not bent, but straight.

2. A fuse box according to claim 1 wherein the fuses comprise polysilicon.

3. A fuse box according to claim 1 wherein the bent portions are oblique relative to the first and second ends.

4. The fuse box according to claim 1 wherein the fuses are laser fuses.

5. A fuse box according to claim 4 wherein the blowing areas of the laser fuses included in the first laser fuse group are at the second ends of the plurality of first laser fuses.

6. A fuse box according to claim 4 wherein the blowing areas of the laser fuses included in the second laser fuse group are at the first ends of the plurality of second laser fuses.

7. A fuse box according to claim 1 wherein the first and second fuse groups are repeatedly placed alternately in the integrated circuit.

8. A fuse box according to claim 1, wherein the fuse box is a redundancy fuse box for replacing a defective memory cell with a redundancy memory cell in an integrated circuit memory device.

9. A fuse box for an integrated circuit device, comprising:
   a first straight fuse having a first narrow end, a second wide end and a straight central portion;
   a second straight fuse having a first wide end, a second narrow end and a straight central portion;
   a first fuse group including a plurality of first fuses each having a first narrow end, a second opposite end which is wider, and a bent central portion; and
   a second fuse group including a plurality of second fuses each having a first wide end, a second opposite end which is narrower, and a bent central portion;
   wherein first and second fuse groups are located between the first and second straight fuses, the first ends of the first straight fuse and the plurality of first fuses are adjacent the first ends of the plurality of second fuses and the second straight fuse, and the second ends of the first straight fuse and the plurality of first fuses are adjacent the second ends of the plurality of second fuses and the second straight fuse.

10. A fuse box according to claim 9 wherein the first straight fuse, the second straight fuse, the plurality of first fuses and the plurality of second fuses each comprise polysilicon.

11. A fuse box according to claim 9 wherein the first straight fuse, the second straight fuse, the plurality of first fuses and the plurality of second fuses are laser fuses.

12. A fuse box according to claim 11 wherein the blowing areas of the laser fuses included in the first laser fuse group and in the first straight fuse are at the second ends thereof.

13. A fuse box according to claim 11 wherein the blowing areas of the laser fuses included in the second laser fuse group and in the second straight fuse are at the first ends thereof.

14. A fuse box according to claim 9 wherein the first straight fuse, the first fuse group, the second fuse group and the second straight fuse are repeatedly placed alternately in the integrated circuit device.

15. A fuse box according to claim 9 wherein the fuse box is a redundancy fuse box for replacing a defective memory cell with a redundancy memory cell in an integrated circuit memory device.

16. A fuse box according to claim 9 wherein the bent portions are oblique relative to the first and second ends.

17. A fuse box for an integrated circuit device, comprising:
   a plurality of spaced-apart fuses each having a narrow end and a wide end, and extending along a predetermined direction, the plurality of spaced-apart fuses including a pair of outer fuses and at least one intermediate fuse, the pair of outer fuses including respective outer surfaces, the respective outer surfaces defining a rectangular area in the integrated circuit device that contains the pair of outer fuses and the at least one intermediate fuse, at least one of the spaced-apart fuses having a bent central portion.

18. A fuse box according to claim 17 wherein the plurality of spaced-apart fuses each comprise polysilicon.

19. A fuse box according to claim 17 wherein the plurality of spaced-apart fuses are laser fuses.

20. A fuse box according to claim 17 wherein the fuse box is a redundancy fuse box for replacing a defective memory cell with a redundancy memory cell in an integrated circuit memory device.

21. A fuse box according to claim 17 wherein the bent central portion is an oblique central portion.

* * * * *